(12) United States Patent
Goto et al.

(10) Patent No.: US 11,742,337 B2
(45) Date of Patent: Aug. 29, 2023

(54) RADIO-FREQUENCY MODULE AND COMMUNICATION DEVICE

(71) Applicant: Murata Manufacturing Co., Ltd., Nagaokakyo (JP)

(72) Inventors: Satoshi Goto, Nagaokakyo (JP); Kazuhito Nakai, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 18/091,423

(22) Filed: Dec. 30, 2022

(65) Prior Publication Data
US 2023/0133510 A1 May 4, 2023

Related U.S. Application Data

(63) Continuation of application No. 17/233,542, filed on Apr. 19, 2021, now Pat. No. 11,574,898.

(30) Foreign Application Priority Data

May 27, 2020 (JP) .................................. 2020-092582

(51) Int. Cl.
*H04B 1/40* (2015.01)
*H01L 23/538* (2006.01)
(Continued)

(52) U.S. Cl.
CPC ........ *H01L 25/16* (2013.01); *H01L 23/49811* (2013.01); *H01L 23/49838* (2013.01);
(Continued)

(58) Field of Classification Search
CPC .... H04B 1/02; H04B 1/04; H04B 2001/0408; H04B 2001/0416; H04B 1/38; H04B 1/40;
(Continued)

(56) References Cited

U.S. PATENT DOCUMENTS 6,961,544 B1 11/2005 Hagström
6,973,330 B2 12/2005 Wieck
(Continued)

FOREIGN PATENT DOCUMENTS

JP 2018-137522 A 8/2018
KR 10-2018-0065967 A 6/2018
WO 2019/244815 A1 12/2019

OTHER PUBLICATIONS

Office Action dated Nov. 29, 2021 in Korean Patent Application No. 10-2021-0036529, 10 pages.

*Primary Examiner* — Quochien B Vuong
(74) *Attorney, Agent, or Firm* — Xsensus LLP

(57) ABSTRACT

A radio-frequency module including a module substrate having a first main surface and a second main surface on opposite sides; a low-noise amplifier disposed on the second main surface; and a power amplifier circuit in a Doherty configuration. The power amplifier including a first phase circuit; a second phase circuit; a carrier amplifier disposed on the first main surface and including an input terminal connected to a first end of the first phase circuit and an output terminal connected to a first end of the second phase circuit; and a peaking amplifier disposed on the first main surface and including an input terminal connected to a second end of the first phase circuit and an output terminal connected to a second end of the second phase circuit.

20 Claims, 6 Drawing Sheets

(51) Int. Cl.
*H03F 1/02* (2006.01)
*H01L 25/16* (2023.01)
*H01L 23/498* (2006.01)
*H03F 3/20* (2006.01)
*H03F 1/56* (2006.01)

(52) U.S. Cl.
CPC ....... *H01L 23/5383* (2013.01); *H03F 1/0288* (2013.01); *H03F 3/20* (2013.01); *H04B 1/40* (2013.01); *H03F 1/56* (2013.01); *H03F 2200/222* (2013.01); *H03F 2200/294* (2013.01); *H03F 2200/451* (2013.01)

(58) Field of Classification Search
CPC .......... H03F 1/0288; H03F 3/189; H03F 3/20; H03F 3/21; H03F 3/213; H01L 23/49811; H01L 23/49822; H01L 23/49827; H01L 23/49838; H01L 23/538; H01L 23/5383; H01L 25/16; H01L 25/262
See application file for complete search history.

(56) References Cited

U.S. PATENT DOCUMENTS

| | | | |
|---|---|---|---|
| 8,391,821 B2 * | 3/2013 | Okabe | H04B 1/38 |
| | | | 455/553.1 |
| 9,712,119 B2 | 7/2017 | Datta et al. | |
| 10,804,866 B2 * | 10/2020 | Lehtola | H03F 3/602 |
| 10,804,867 B2 | 10/2020 | Lehtola et al. | |
| 10,972,055 B2 | 4/2021 | Naraine et al. | |
| 11,462,821 B2 * | 10/2022 | Lee | H04B 1/04 |
| 2020/0253040 A1 * | 8/2020 | Dalmia | H01L 23/49838 |

* cited by examiner

RADIO-FREQUENCY MODULE AND COMMUNICATION DEVICE

CROSS-REFERENCE TO RELATED APPLICATIONS

The present application is a continuation of U.S. patent application Ser. No. 17/233,542, filed Apr. 19, 2021, which claims priority to Japanese patent application JP2020-092582, filed May 27, 2020, the entire contents of each being incorporated herein by reference.

BACKGROUND

1. Field of the Disclosure

The present disclosure relates to a radio-frequency module and a communication device.

2. Description of the Related Art

Mobile communication apparatuses such as mobile phones incorporate power amplifiers that amplify radio-frequency transmission signals. Japanese Unexamined Patent Application Publication No. 2018-137522 discloses a front-end circuit (radio-frequency (RF) module) including a power-amplifier (PA) circuit (transmission amplifier circuit) for transmission of transmission signals and a low-noise amplifier (LNA) circuit (reception amplifier circuit) for transmission of reception signals. The transmission amplifier circuit includes a PA control unit configured to control amplification characteristics of power amplifiers, and the reception amplifier circuit includes an LNA control unit configured to control amplification characteristics of low-noise amplifiers.

The transmission amplifier circuit may be a power amplifier circuit in Doherty configuration, which is capable of providing high efficiency and high power but has a high part counts; that is, the power amplifier circuit includes multiple circuit elements, such as a carrier amplifier, a peaking amplifier, and a phase circuit. The use of a Doherty power amplifier circuit as the transmission amplifier circuit necessitates compromising the isolation of the reception amplifier circuit from the transmission amplifier circuit that transmits high-power transmission signals.

SUMMARY

The present disclosure therefore has been made to solve the problems described above, and it is an object of the present disclosure to provide a radio-frequency module and a communication device that achieve size reduction in a way that least compromises the isolation of a receiving circuit from a transmission power amplifier circuit in Doherty configuration.

According to an aspect of the present disclosure, a radio-frequency module including a module substrate having a first main surface and a second main surface on opposite sides; a low-noise amplifier disposed on the second main surface; and a power amplifier circuit in a Doherty configuration. The power amplifier including a first phase circuit; a second phase circuit; a carrier amplifier disposed on the first main surface and including an input terminal connected to a first end of the first phase circuit and an output terminal connected to a first end of the second phase circuit; and a peaking amplifier disposed on the first main surface and including an input terminal connected to a second end of the first phase circuit and an output terminal connected to a second end of the second phase circuit.

Other features, elements, characteristics and advantages of the present disclosure will become more apparent from the following detailed description of preferred embodiments of the present disclosure with reference to the attached drawings.

DETAILED DESCRIPTION

Figure 1:
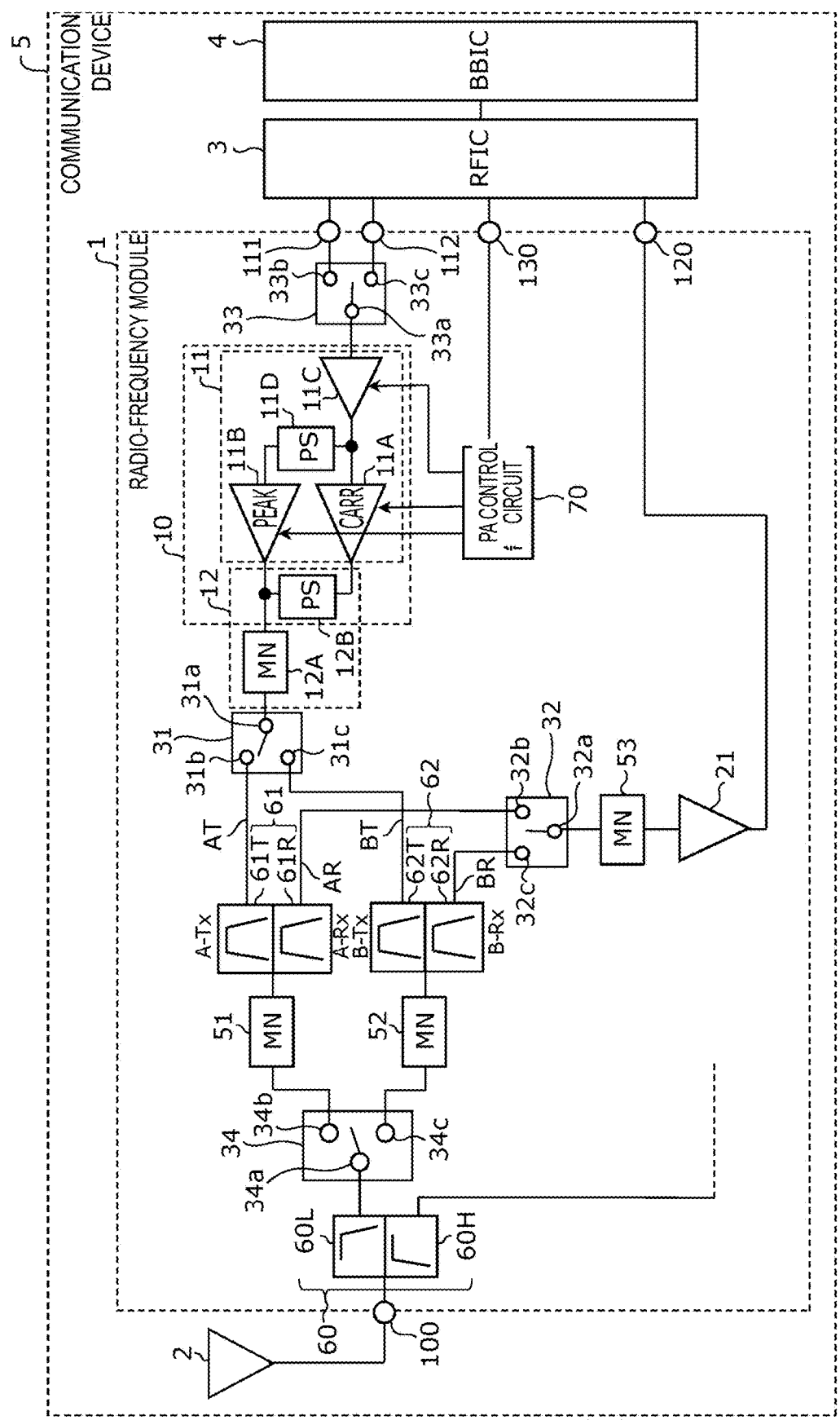
FIG. 1 is a circuit configuration diagram of a radio-frequency module and a communication device according to an embodiment of the present disclosure.

Hereinafter, an embodiment of the present disclosure will be described in detail. The following embodiment is a general or specific example. Details such as values, shapes, materials, constituent elements, and arrangements and connection patterns of the constituent elements in the following embodiment are provided merely as examples and should not be construed as limiting the present disclosure. Of the constituent elements in the following embodiment, examples, and modifications, those not mentioned in independent claims are described as optional constituent elements. The sizes and the relative proportions of the constituent elements illustrated in the drawings are not necessarily to scale. Redundant description of substantially the same constituent elements, which are denoted by the same reference signs in the drawings, will be omitted or brief description of the elements will be provided where appropriate.

The words (e.g., parallel, perpendicular) hereinafter used to describe the relationship between elements, the words (e.g., rectangular) hereinafter used to describe the shapes of elements, and numerical ranges hereinafter in the description should not necessarily be interpreted in the strict sense and can be understood as meaning that a margin of several percent is acceptable as substantial equivalence.

Regarding A, B, and C mounted on a substrate, the expression "when the substrate (or a main surface of the substrate) is viewed in a plan view, C is disposed between A and B" herein means that at least one of lines connecting freely selected points in A to freely selected points in B passes through C when the substrate is viewed in a plan view. The expression "the substrate is viewed in a plan view" herein means that the substrate and circuit elements on the substrate are viewed in such a manner that they are orthographically projected on a plane parallel to the main surface of the substrate.

The term "transmission path" hereinafter refers to a transmission line constructed of, for example, wiring through which radio-frequency transmission signals are propagated, an electrode connected directly to the wiring, and terminals connected directly to the wiring or to the electrode. The term "reception path" hereinafter refers to a transmission line constructed of, for example, wiring through which radio-frequency reception signals are propagated, an electrode connected directly to the wiring, and terminals connected directly to the wiring or to the electrode. The term "transmission-reception path" hereinafter refers to a transmission line constructed of, for example, wiring through which radio-frequency transmission signals and radio-frequency reception signals are propagated, an electrode connected directly to the wiring, and terminals connected directly to the wiring or to the electrode.

Embodiment

1. Circuit Configuration of Radio-Frequency Module 1 and Communication Device 5

FIG. 1 is a circuit configuration diagram of a radio-frequency module 1 and a communication device 5 according to the present embodiment. As illustrated in FIG. 1, the communication device 5 includes the radio-frequency module 1, an antenna 2, a radio-frequency integrated circuit (RFIC) 3, and a baseband integrated circuit (BBIC) 4.

The RFIC 3 is an RF signal processing circuit that processes radio-frequency signals transmitted via the antenna 2 and radio-frequency signals received via the antenna 2. Specifically, the RFIC 3 performs signal processing such as down-conversion on radio-frequency signals input through reception paths of the radio-frequency module 1 and outputs the resultant reception signals to the BBIC 4. The RFIC 3 performs signal processing such as up-conversion on transmission signals from the BBIC 4 and outputs the resultant transmission signals to transmission signal paths of the radio-frequency module 1.

The BBIC 4 is a circuit that performs signal processing using intermediate frequency bands lower than the frequency bands of radio-frequency signals transmitted through the radio-frequency module 1. The signals processed by the BBIC 4 are used, for example, as image signals for displaying an image or as audio signals for a telephone conversation through a speaker.

The RFIC 3 also functions as a control unit configured to control, in accordance with the communication band (frequency band) in use, connections in switches that are included in the radio-frequency module 1 and are denoted by 31, 32, 33, and 34, respectively. Specifically, the RFIC 3 causes, by using control signals (not illustrated), the individual switches 31 to 34 of the radio-frequency module 1 to perform connection switching. More specifically, the RFIC 3 outputs, to a power amplifier (PA) circuit 70, digital control signals for controlling the switches 31 to 34. In accordance with the digital control signals from the RFIC 3, the PA control circuit 70 of the radio-frequency module 1 outputs digital control signals to the switches 31 to 34 so as to control switching between the connected state and the non-connected state in each of the switches 31 to 34.

The RFIC 3 also functions as a control unit configured to control gains of a carrier amplifier 11A, a peaking amplifier 11B, and a preamplifier 11C, which are included in the radio-frequency module 1 and may hereinafter also collectively referred to as power amplifiers, and to control a power supply voltage Vcc and a bias voltage Vbias, which are applied to the power amplifiers. Specifically, RFIC 3 outputs digital control signals such as mobile industry processor interface (MIPI) signals and general-purpose input/output (GPIO) signals to a control signal terminal 130, which is provided to the radio-frequency module 1. In accordance with the digital control signals input through the control signal terminal 130, the PA control circuit 70 of the radio-frequency module 1 outputs control signals, the power supply voltage Vcc, or the bias voltage Vbias to the power amplifiers so as to adjust the gains of the power amplifiers. Different control signal terminals may be provided so that one of the control signal terminal receives, from the RFIC 3, digital control signals for controlling the gains of the power amplifiers and the other control signal terminal receives, from the RFIC 3, digital control signals for controlling the power supply voltage Vcc and the bias voltage Vbias that are to be applied to the power amplifiers. The control unit may be disposed outside the RFIC 3. Specifically, the control unit may, for example, be disposed in the BBIC 4.

The antenna 2 is connected to an antenna connection terminal 100 of the radio-frequency module 1 to radiate radio-frequency signals output by the radio-frequency module 1 and to enable the radio-frequency module 1 to receive radio-frequency signals from the outside.

The communication device 5 according to the present embodiment may optionally include the antenna 2 and the BBIC 4.

The following describes, in detail, the configuration of the radio-frequency module 1.

As illustrated in FIG. 1, the radio-frequency module 1 includes the antenna connection terminal 100, a power amplifier circuit 10, a low-noise amplifier 21, transmitting filters 61T and 62T, receiving filters 61R and 62R, the PA control circuit 70, matching circuits 12A, 51, 52, and 53, the switches 31, 32, 33, and 34, and a diplexer 60.

The antenna connection terminal 100 is connected to the antenna 2.

The power amplifier circuit 10 is an amplifier circuit in Doherty configuration and amplifies transmission signals input through a transmission input terminal 111 and transmission signals input through a transmission input terminal 112; that is, the power amplifier circuit 10 amplifies transmission signals in a communication band A and transmission signals in a communication band B. The radio-frequency module 1 may include, in place of the power amplifier circuit 10, a first amplifier circuit in Doherty configuration and a second amplifier circuit in Doherty configuration. The first amplifier circuit amplifies radio-frequency signals in the communication band A, and the second amplifier circuit amplifies radio-frequency signals in the communication band B.

The PA control circuit 70 adjusts the gains of the power amplifiers of the power amplifier circuit 10 in accordance with, for example, MIPI signals and GPIO signals that are digital control signals input through the control signal terminal 130. The PA control circuit 70 may be a semiconductor integrated circuit (IC). The semiconductor IC is, for example, a complementary metal oxide semiconductor (CMOS). Specifically, the semiconductor IC is fabricated by means of a silicon on insulator (SOI) process. Such a semiconductor IC can thus be produced inexpensively. The semiconductor IC may be formed from at least one of GaAs, SiGe, and GaN such that the semiconductor IC can output radio-frequency signals with excellent amplification performance and excellent noise performance.

The low-noise amplifier 21 is an amplifier that amplifies radio-frequency signals in the communication band A and radio-frequency signals in the communication band B in a manner so as to ensure low noise and outputs the resultant signals to a reception output terminal 120. The radio-frequency module 1 may include more than one low-noise amplifier. For example, the radio-frequency module 1 may include a first low-noise amplifier and a second low-noise amplifier. The first low-noise amplifier amplifies radio-frequency signals in the communication band A, and the second low-noise amplifier amplifies radio-frequency signals in the communication band B.

The transmitting filter 61T is disposed on a transmission path AT, which connects the transmission input terminals 111 and 112 to the antenna connection terminal 100. Of the transmission signals amplified by the power amplifier circuit 10, transmission signals in the communication band A are allowed to pass through the transmitting filter 61T. The transmitting filter 62T is disposed on a transmission path BT, which connects the transmission input terminals 111 and 112 to the antenna connection terminal 100. Of the transmission signals amplified by the power amplifier circuit 10, transmission signals in the communication band B are allowed to pass through the transmitting filter 62T.

The receiving filter 61R is disposed on a reception path AR, which connects the reception output terminal 120 to the antenna connection terminal 100. Of the reception signals input through the antenna connection terminal 100, reception signals in the communication band A are allowed to pass through the receiving filter 61R. The receiving filter 62R is disposed on a reception path BR, which connects the reception output terminal 120 to the antenna connection terminal 100. Of the reception signals input through the antenna connection terminal 100, reception signals in the communication band B are allowed to pass through the receiving filter 62R.

The transmitting filter 61T and the receiving filter 61R constitute a duplexer 61, the pass band of which is the communication band A. The duplexer 61 operates in the frequency division duplex (FDD) mode to transmit transmission signals and reception signals in the communication band A. The transmitting filter 62T and the receiving filter 62R constitute a duplexer 62, the pass band of which is the communication band B. The duplexer 62 operates in the FDD mode to transmit transmission signals and reception signals in the communication band B.

The duplexers 61 and 62 may each be a multiplexer including transmitting filters only, a multiplexer including receiving filters only, or a multiplexer constructed of duplexers. It is not required that the duplexer 61 including the transmitting filter 61T and the receiving filter 61R be provided. The duplexer 61 may be replaced with a filter that operates in the time division duplex (TDD) mode to transmit signals. In this case, a switch operable to switch between transmission and reception is disposed so as to precede or follow the filter, or the radio-frequency module 1 may include two such switches, one of which is disposed so as to precede the filter and the other one of which is disposed so as to follow the filter. Similarly, it is not required that the duplexer 62 including the transmitting filter 62T and the receiving filter 62R be provided. The duplexer 62 may be replaced with a filter that operates in the TDD mode to transmit signals.

The matching circuit 12A is disposed on a transmission path connecting the power amplifier circuit 10 to the transmitting filters 61T and 62T and provides impedance matching between the power amplifier circuit 10 and the transmitting filter 61T and impedance matching between the power amplifier circuit 10 and the transmitting filter 62T.

The matching circuit 51 is disposed on a path connecting the switch 34 to the duplexer 61 and provides impedance matching between the switch 34 and the duplexer 61 and impedance matching between antenna 2 and the duplexer 61. The matching circuit 52 is disposed on a path connecting the switch 34 to the duplexer 62 and provides impedance matching between the switch 34 and the duplexer 62 and impedance matching between the antenna 2 and the duplexer 62.

The matching circuit 53 is disposed on a path connecting the low-noise amplifier 21 to the switch 32 and provides impedance matching between the low-noise amplifier 21 and the switch 32, impedance matching between the low-noise amplifier 21 and the duplexer 61, and impedance matching between the low-noise amplifier 21 and the duplexer 62.

The switch 31 includes a common terminal 31a and selection terminals 31b and 31c. The common terminal 31a is connected to an output terminal of the power amplifier circuit 10 via the matching circuit 12A. The selection terminal 31b is connected to the transmitting filter 61T, and the selection terminal 31c is connected to the transmitting filter 62T. With the terminals being connected as above, the switch 31 performs switching between the state in which the power amplifier circuit 10 is connected to the transmitting filter 61T and the state in which the power amplifier circuit 10 is connected to the transmitting filter 62T. The switch 31 is, for example, a single-pole, double-throw (SPDT) switch circuit.

The switch 32 includes a common terminal 32a and selection terminals 32b and 32c. The common terminal 32a is connected to an input terminal of the low-noise amplifier 21 via the matching circuit 53. The selection terminal 32b is connected to the receiving filter 61R, and the selection terminal 32c is connected to the receiving filter 62R. With the terminals being connected as above, the switch 32 performs switching between the state in which the low-noise amplifier 21 is connected to the receiving filter 61R and the state in which the low-noise amplifier 21 is not connected to the 61R and performs switching between the state in which the low-noise amplifier 21 is connected to the receiving filter 62R and the state in which the low-noise amplifier 21 is not connected to the receiving filter 62R. The switch 32 is, for example, an SPDT switch circuit.

The switch 34 is an example of an antenna switch and is connected to the antenna connection terminal 100 via the diplexer 60. The switch 34 performs (1) switching between the state in which the antenna connection terminal 100 is connected to the duplexer 61 and the state in which the antenna connection terminal 100 is not connected to the duplexer 61 and (2) switching between the state in which the antenna connection terminal 100 is connected to the duplexer 62 and the state in which the antenna connection terminal 100 is not connected to the duplexer 62. The switch 34 may be a multi-connection switching circuit capable of performing (1) and (2) at the same time, that is, capable of connecting the antenna connection terminal 100 to both the duplexers 61 and 62 at the same time.

The switch 33 includes a common terminal 33a and selection terminals 33b and 33c. The common terminal 33a is connected to an input terminal of the power amplifier circuit 10. The selection terminal 33b is connected to the transmission input terminal 111, and the selection terminal 33c is connected to the transmission input terminal 112. With the terminals being connected as mentioned above, the switch 33 performs switching between the state in which the power amplifier circuit 10 is connected to the transmission input terminal 111 and the state in which the power amplifier circuit 10 is connected to the transmission input terminal 112. The switch 33 is, for example, an SPDT switch circuit.

For example, transmission signals in the communication band A are input through the transmission input terminal 111, and transmission signals in the communication band B are input through the transmission input terminal 112. Alternatively, transmission signals in the communication band A or B for the fourth-generation mobile communication system (4G) may be input through the transmission input terminal 111, and transmission signals in the communication band A or B for the fifth-generation mobile communication system (5G) may be input through the transmission input terminal 112.

The diplexer 60 is an example of a multiplexer and includes filters 60L and 60H. The pass band of the filter 60L is a frequency range including the communication bands A and B, and the pass band of the filter 60H is a frequency range different from the frequency range including the communication bands A and B. The filters 60L and 60H each include a terminal connected to the antenna connection terminal 100. The filters 60L and 60H each include an inductor in chip form and/or a capacitor in chip form and may each be an inductor-capacitor (LC) filter. When the frequency range including the communication bands A and B is on the lower side than the other frequency range (i.e., the frequency range different from the frequency range including the communication bands A and B), the filter 60L may be a low-pass filter, and the filter 60H may be a high-pass filter.

The transmitting filters 61T and 62T and the receiving filters 61R and 62R may be acoustic wave filters using surface acoustic waves (SAWs), acoustic wave filters using bulk acoustic waves (BAWs), LC resonant filters, or dielectric filters but are not limited thereto.

The radio-frequency module 1 is configured as follows. The switch 33, the power amplifier circuit 10, the matching circuit 12A, the switch 31, the transmitting filter 61T, the matching circuit 51, and the switch 34 constitute a first transmitting circuit that transmits transmission signals in the communication band A to the antenna connection terminal 100. The switch 34, the matching circuit 51, the receiving filter 61R, the switch 32, the matching circuit 53, and the low-noise amplifier 21 constitute a first receiving circuit that transmits reception signals in the communication band A from the antenna 2 through the antenna connection terminal 100.

The switch 33, the power amplifier circuit 10, the matching circuit 12A, the switch 31, the transmitting filter 62T, the matching circuit 52, and the switch 34 constitute a second transmitting circuit that transmits transmission signals in the communication band B to the antenna connection terminal 100. The switch 34, the matching circuit 52, the receiving filter 62R, the switch 32, the matching circuit 53, and the low-noise amplifier 21 constitute a second receiving circuit that transmits reception signals in the communication band B from the antenna 2 through the antenna connection terminal 100.

The circuit configuration above enables the radio-frequency module 1 to transmit radio-frequency signals in the communication band A or B and/or to receive radio-frequency signals in the communication band A or B. The circuit configuration above also enables the radio-frequency module 1 to transmit radio-frequency signals in the communication band A and radio-frequency signals in the communication band B at the same time, to receive radio-frequency signals in the communication band A and radio-frequency signals in the communication band B at the same time, or to transmit and receive radio-frequency signals in the communication band A and radio-frequency signals in the communication band B at the same time.

It is not required that the two transmitting circuits and the two receiving circuits of the radio-frequency module according to the present disclosure be connected to the antenna connection terminal 100 via the switch 34. The two transmitting circuits and the two receiving circuits may be connected to the antenna 2 via their respective terminals. With regard to the circuit configuration illustrated in FIG. 1, it is only required that the power amplifier circuit 10 and the low-noise amplifier 21 be included in the radio-frequency module according to the present disclosure.

The low-noise amplifier 21 and at least one of the switches 31 to 34 may be incorporated in a semiconductor IC. The semiconductor IC is, for example, a CMOS. Specifically, the semiconductor IC is fabricated by means of an SOI process. Such a semiconductor IC can thus be produced inexpensively. The semiconductor IC may be formed from at least one of GaAs, SiGe, and GaN such that the semiconductor IC can output radio-frequency signals with excellent amplification performance and excellent noise performance.

The following describes, in detail, the circuit configuration of the power amplifier circuit 10.

As illustrated in FIG. 1, the power amplifier circuit 10 includes the carrier amplifier 11A, the peaking amplifier 11B, the preamplifier 11C, and phase circuits 11D and 12B.

The carrier amplifier 11A, the peaking amplifier 11B, the preamplifier 11C, and the phase circuit 11D constitute a power amplifier IC 11. The power amplifier IC 11 is an example of a first semiconductor IC. The carrier amplifier 11A, the peaking amplifier 11B, the preamplifier 11C, and the phase circuit 11D may be mounted on a substrate or may be incorporated in a package.

The phase circuit 12B and the matching circuit 12A constitute a matching IC 12. The phase circuit 12B and the matching circuit 12A of the matching IC 12 may be mounted on a substrate or may be incorporated in a package.

The preamplifier 11C includes an input terminal connected to the common terminal 33a of the switch 33. The carrier amplifier 11A includes an input terminal connected to one end of the phase circuit 11D, and the peaking amplifier 11B includes an input terminal connected to the other end of the phase circuit 11D. The carrier amplifier 11A includes an output terminal connected to one end of the phase circuit 12B, and the peaking amplifier 11B includes an output terminal connected to the other end of the phase circuit 12B.

The carrier amplifier 11A is, for example, a Class A amplifier circuit or a Class AB amplifier circuit and is capable of providing high-efficiency amplification in the low power range and the middle power range.

The peaking amplifier 11B is, for example, a Class C amplifier circuit and is capable of providing high-efficiency amplification in the high power range.

The phase circuit 11D (first phase circuit) and the phase circuit 12B (second phase circuit) are capable of shifting the phase of radio-frequency signals input to the respective circuits and may each be a λ/4 transmission line.

With the circuit elements of the power amplifier circuit 10 being connected as above, the output impedance of the peaking amplifier 11B varies in accordance with the output level of the power amplifier circuit 10. Thus, high-efficiency amplification in the low-to-middle power range (i.e., the normal output range) is achieved through the operation of the carrier amplifier 11A, and high-efficiency amplification in the high power range is achieved through the operation of both the carrier amplifier 11A and the peaking amplifier 11B.

The power amplifier circuit 10 in Doherty configuration achieves high-efficiency amplification in all of the power ranges by making combined use of the carrier amplifier 11A and the peaking amplifier 11B in accordance with the output level.

The power amplifier circuit 10 may optionally include the preamplifier 11C. It is not required that the phase circuits 11D and 12B each be a λ/4 transmission line.

The carrier amplifier 11A, the peaking amplifier 11B, the preamplifier 11C, and the low-noise amplifier 21 may each be a field-effect transistor (FET) or a heterojunction bipolar transistor (HBT) and may be formed from a silicon-based CMOS or GaAs.

The power amplifier circuit 10 in Doherty configuration has a large parts count; that is, the power amplifier circuit 10 includes multiple circuit elements such as the carrier amplifier 11A, the peaking amplifier 11B, the preamplifier 11C, and the phase circuits 11D and 12B. The radio-frequency module 1 mounted on a single mounting substrate may thus be large in size. This configuration necessitates compromising the isolation of the receiving circuits from the power amplifier circuit 10 that transmits high-power transmission signals.

The radio-frequency module 1 according to the present embodiment achieves size reduction in a way that least compromises the isolation of the receiving circuits from the transmitting circuits including the power amplifier circuit 10. The following describes the configuration of the radio-frequency module 1 that least compromises the isolation to achieve size reduction.

2. Layout of Circuit Elements of Radio-Frequency Module 1A According to Example 1

Figure 2A:
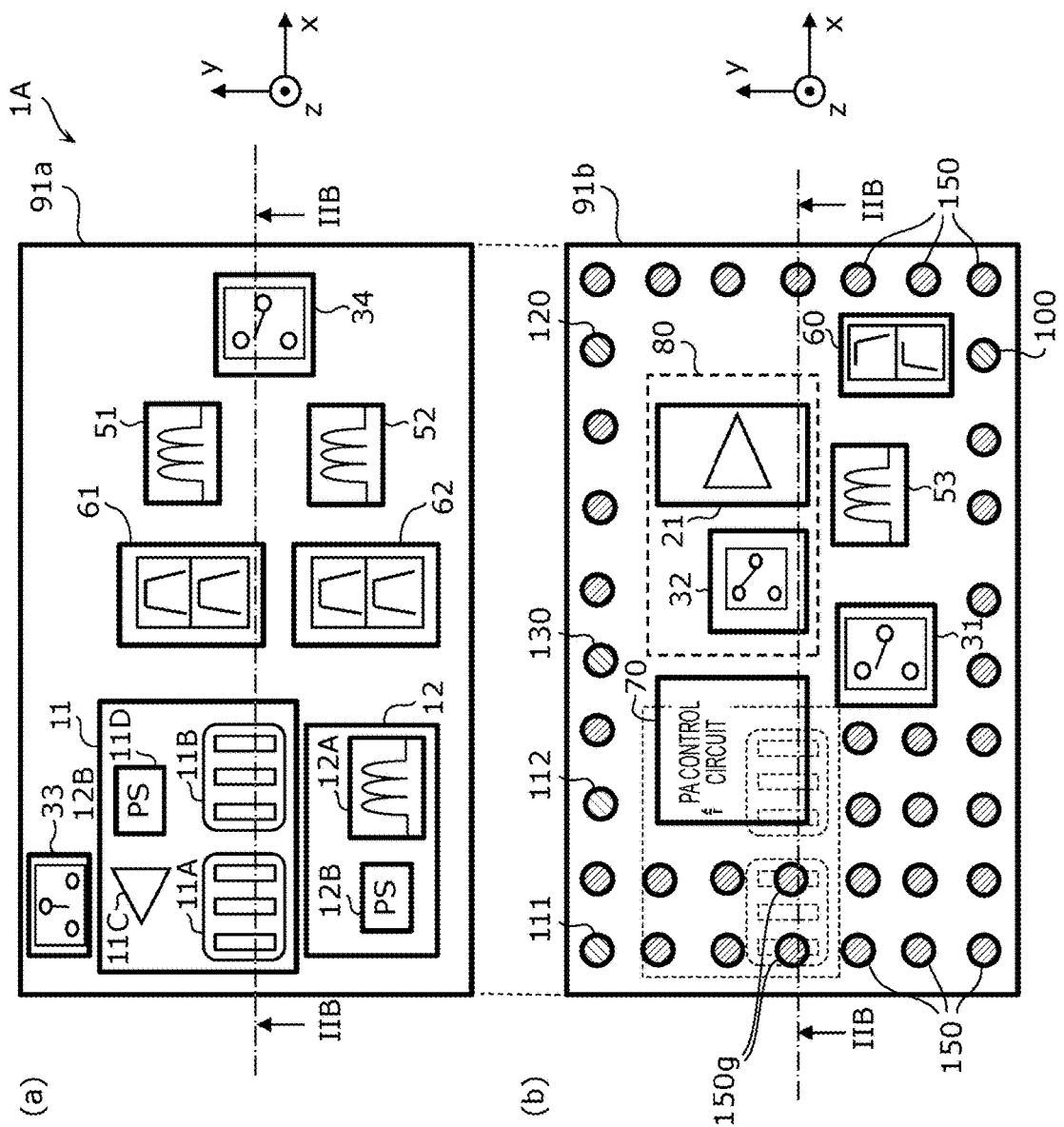
FIG. 2A is a schematic diagram illustrating the planar configuration of a radio-frequency module according to Example 1.
Figure 2B:
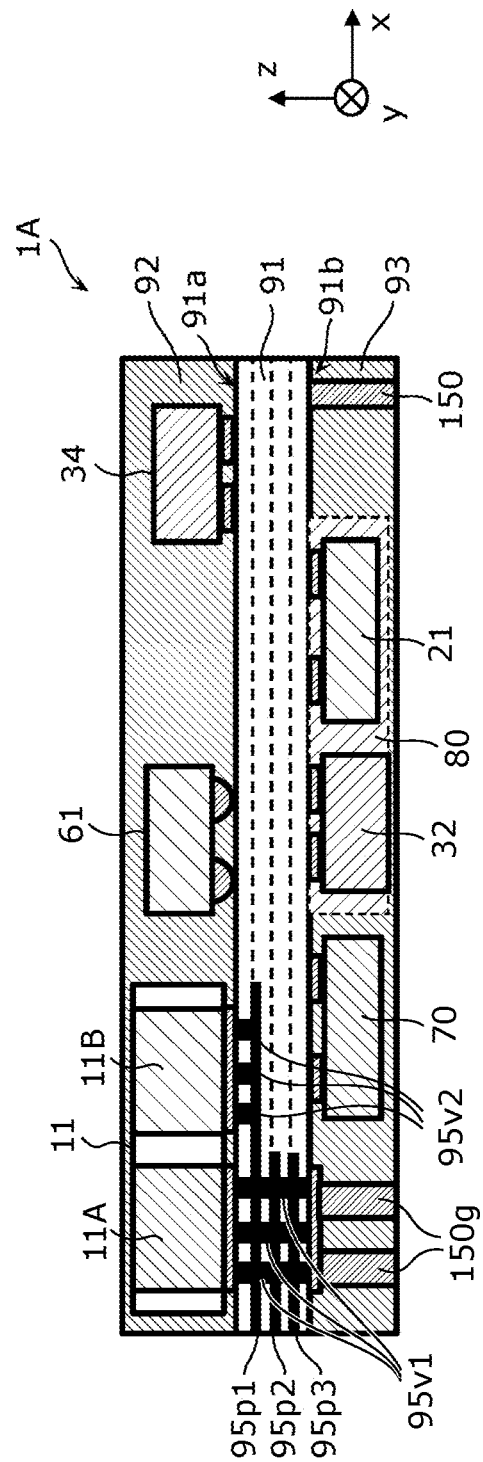
FIG. 2B is a schematic diagram illustrating the sectional configuration of the radio-frequency module according to Example 1.

FIG. 2A is a schematic diagram illustrating the planar configuration of a radio-frequency module 1A according to Example 1. FIG. 2B is a schematic diagram illustrating the sectional configuration of the radio-frequency module 1A according to Example 1. More specifically, FIG. 2B is a sectional view taken along line IIB-IIB in FIG. 2A. Part (a) of FIG. 2A illustrates the layout of circuit elements on a module substrate 91 having main surfaces 91a and 91b on opposite sides, with the main surface 91a being seen from the positive side in the z-axis direction. Part (b) of FIG. 2A illustrates the layout of the circuit elements, with the main surface 91b being seen through from the positive side in the z-axis direction.

The layout of the circuit elements of the radio-frequency module 1 according to the present embodiment will be specifically presented in the following description of the radio-frequency module 1A according to Example 1.

As illustrated in FIGS. 2A and 2B, the radio-frequency module 1A according to Example 1 adopts the circuit configuration in FIG. 1 and also includes the module substrate 91, resin members 92 and 93, and external connection terminals 150.

The module substrate 91 has the main surface 91a (first main surface) and the main surface 91b (second main surface) on opposite sides. The transmitting circuits and the receiving circuits are mounted on the module substrate 91. Substrates that may be used as the module substrate 91 include: a low-temperature co-fired ceramic (LTCC) substrate including dielectric layers stacked on one another; a high-temperature co-fired ceramic (HTCC) substrate including dielectric layers stacked on one another; a substrate provided with a redistribution layer (RDL); and a printed circuit board. The antenna connection terminal 100, the transmission input terminals 111 and 112, the reception output terminal 120, and the control signal terminal 130 may be provided on the module substrate 91.

The resin member 92 is disposed so as to cover the main surface 91a of the module substrate 91. The transmitting circuits and the receiving circuits are each partially covered with the resin member 92. The resin member 92 enables the circuit elements constituting the transmitting circuits and the circuit elements constituting the receiving circuits to maintain reliability in terms of, for example, mechanical strength and moisture resistance. The resin member 93 is disposed so as to cover the main surface 91b of the module substrate 91. The transmitting circuits and the receiving circuits are each partially covered with the resin member 93. The resin member 93 enables the circuit elements constituting the transmitting circuits and the circuit elements constituting the receiving circuits to maintain reliability in terms of, for example, mechanical strength and moisture resistance. The radio-frequency module according to the present disclosure may optionally include the resin members 92 and 93.

Referring to FIGS. 2A and 2B illustrating the radio-frequency module 1A according to Example 1, the power amplifier IC 11, the matching IC 12, the duplexers 61 and 62, the matching circuit 51 and 52, and the switches 33 and 34 are disposed on the main surface 91a. The low-noise amplifier 21, the PA control circuit 70, the matching circuit 53, the switches 31 and 32, and the diplexer 60 are disposed on the main surface 91b.

The transmission paths AT and BT and the reception paths AR and BR in FIG. 1 include wiring (not illustrated in FIG. 2A), which is provided in the module substrate 91 and on the main surfaces 91a and 91b. The wiring may be constructed of bonding wires having ends each of which is bonded to the main surface 91a, the main surface 91b, or any one of the circuit elements of the radio-frequency module 1A. Alternatively, the wiring may be constructed of terminals, electrodes, or traces on the surface of the circuit elements of the radio-frequency module 1A.

In Example 1, the carrier amplifier 11A and the peaking amplifier 11B are disposed on the main surface 91a, and the low-noise amplifier 21 is disposed on the main surface 91b.

That is, the carrier amplifier 11A and the peaking amplifier 11B of the power amplifier circuit 10 are disposed opposite the low-noise amplifier 21, with the module substrate 91 being located between the power amplifier circuit 10 and the low-noise amplifier 21. Unlike the case where both the power amplifier circuit 10 and the low-noise amplifier 21 are disposed on one side of the module substrate 91, the layout above enables the radio-frequency module 1A to achieve size reduction in a way that least compromises the isolation of the receiving circuits from the transmission circuits, thus eliminating or reducing the possibility that transmission signals and harmonic waves of the signals will flow into the reception paths, and the degradation of reception sensitivity is inhibited accordingly.

The external connection terminals 150 are disposed on the main surface 91b of the module substrate 91. Through the external connection terminals 150, the radio-frequency module 1A transmits electrical signals to an external substrate and receives electrical signals from the external substrate. The external substrate is disposed on the negative side in the z-axis direction of the radio-frequency module 1A. As illustrated in part (b) of FIG. 2A, the antenna connection terminal 100, the transmission input terminals 111 and 112, the reception output terminal 120, and the control signal terminal 130 are each one of the external connection terminals. External connection terminals 150g, each of which is one of the external connection terminals 150, are placed at the ground potential of the external substrate.

As illustrated in FIG. 2B, the radio-frequency module 1A also includes via conductors 95$v$1, via conductors 95$v$2, a planar conductor 95$p$1, a planar conductor 95$p$2, and a planar conductor 95$p$3, which are provided in the module substrate 91. The via conductors 95$v$1, the via conductors 95$v$2, the planar conductor 95$p$1, the planar conductor 95$p$2, and the planar conductor 95$p$3 constitute an example of a heat-dissipating conductor portion that is provided in the module substrate 91 to form a connection between the main surface 91$a$ and the main surface 91$b$. On the main surface 91$a$, the heat-dissipating conductor portion is connected to a ground electrode of the carrier amplifier 11A and to a ground electrode of the peaking amplifier 11B. On the main surface 91$b$, the heat-dissipating conductor portion is connected to the external connection terminals 150$g$ (first external connection terminals).

The via conductors 95$v$1 and the via conductors 95$v$2 extend perpendicularly to the main surfaces 91$a$ and 91$b$ (i.e., in the z-axis direction). The planar conductors 95$p$1, 95$p$2, and 95$p$3 lie parallel to the main surfaces 91$a$ and 91$b$ and are in contact with neither the main surface 91$a$ nor the main surface 91$b$.

The via conductors 95$v$1 constitute an example of a first via conductor. The via conductors 95$v$1 each have an end connected, on the main surface 91$a$, to the ground electrode of the carrier amplifier 11A and each have an end connected, on the main surface 91$b$, to the external connection terminals 150$g$. Each via conductor 95$v$1 between the ends thereof is connected to the planar conductors 95$p$1, 95$p$2, and 95$p$3.

The via conductors 95$v$2 constitute an example of a second via conductor. The via conductors 95$v$2 each have an end connected, on the main surface 91$a$, to the ground electrode of the peaking amplifier 11B and each have an end connected to the planar conductor 95$p$1. The via conductors 95$v$2 are not exposed at the main surface 91$b$.

When the module substrate 91 is viewed in a plan view, the via conductors 95$v$1 overlap the carrier amplifier 11A, and the via conductors 95$v$2 overlap the peaking amplifier 11B.

The carrier amplifier 11A is connected to the external connection terminals 150$g$ through the via conductors 95$v$1 for heat dissipation. The peaking amplifier 11B is connected to the external connection terminals 150$g$ through the via conductors 95$v$2, the planar conductor 95$p$1, and the via conductors 95$v$1 for heat dissipation.

The power amplifier circuit 10 is a high heat-generating circuit component of the radio-frequency module 1A. In order for the radio-frequency module 1A to achieve enhanced dissipation of heat, it is important that heat generated in the power amplifier circuit 10 be transferred to the external substrate through heat transfer paths of low thermal resistance. However, the following problem may arise if the power amplifier circuit 10 is mounted on the main surface 91$b$. In this case, electrode wiring connected to the power amplifier circuit 10 is disposed on the main surface 91$b$, and a heat transfer path that passes through only a planar wiring pattern lying on the main surface 91$b$ (in an x-y plane) is one of the heat transfer paths of the power amplifier circuit 10. The planar wiring pattern is formed of a thin metal film and has a high thermal resistance accordingly. This means that the disadvantage of disposing the power amplifier circuit 10 on the main surface 91$b$ is the degradation in heat dissipation characteristics.

As a workaround, the radio-frequency module 1A according to Example 1 includes the via conductors 95$v$1 for heat dissipation that are connected, on the main surface 91$a$, to the ground electrode of the power amplifier circuit 10 and extend from the main surface 91$a$ to the main surface 91$b$. The via conductors 95$v$1 are connected, on the main surface 91$b$, to the external connection terminals 150$g$ placed at the ground potential.

That is, the power amplifier circuit 10 is connected to the external connection terminals 150$g$ through the via conductors 95$v$1 for heat dissipation. Heat generated in the power amplifier circuit 10 may be dissipated without having to use the heat transfer path that passes through only the planar wiring pattern lying in the x-y plane and having a thermal resistance higher than that of any other wiring path in the module substrate 91. The via conductors 95$v$1, which extend through the module substrate 91 perpendicularly to the main surfaces 91$a$ and 91$b$, have such low thermal resistance that heat generated in the power amplifier circuit 10 can be dissipated efficiently to the outside of the radio-frequency module 1A.

The peaking amplifier 11B operates in the high power range only, whereas the carrier amplifier 11A continuously operates in low-to-high power ranges. When the amplification operation is continued for a given period of time, the amount of heat generated in the carrier amplifier 11A is thus greater than the amount of heat generated in the peaking amplifier 11B.

With this in view, the radio-frequency module 1A according to Example 1 is configured such that heat generated in the carrier amplifier 11A is dissipated through the via conductors 95$v$1 extending through the module substrate. That is, the heat generated in the carrier amplifier 11A is dissipated with a high degree of efficiency through heat transfer paths of low thermal resistance. The heat generated in the peaking amplifier 11B is dissipated through not only the via conductors 95$v$1 but also the planar conductor 95$p$1 and the via conductors 95$v$2. That is, the heat generated in the peaking amplifier 11B is dissipated less efficiently through the heat transfer paths whose thermal resistance is higher than the thermal resistance of the heat transfer paths for the heat generated in the carrier amplifier 11A. However, the disparity in the heat dissipation efficiency can be offset by the fact that the amount of heat generated in the carrier amplifier 11A is greater than the amount of heat generated in the peaking amplifier 11B. The heat transfer paths enable well-balanced thermal dissipation accordingly. The structure of the heat-dissipating conductor portion in Example 1 enables the radio-frequency module 1A to dissipate the heat of the power amplifier circuit 10 efficiently to the outside.

There is an overlap between the main surface 91$b$ and the peaking amplifier 11B when the module substrate 91 is viewed in a plan view. The via conductors for heat dissipation are not exposed at the main surface 91$b$ in the overlapping region. The external connection terminals 150$g$ are not disposed in the overlapping region. The overlapping region, in which the main surface 91$b$ overlaps the peaking amplifier 11B, can thus be a mounting place for a circuit element, such as the PA control circuit 70 as illustrated in part (b) of FIG. 2A and in FIG. 2B. This leads to the enhanced efficiency in the layout of the circuit elements on the main surface 91$b$, and space savings can be achieved accordingly. Another advantage of disposing the PA control circuit 70 in the overlapping region is a shortening of control wiring that connects the carrier amplifier 11A, the peaking amplifier 11B, and the PA control circuit 70 to each other. This enables a reduction in the digital noise in the control wiring.

It is not required that the PA control circuit 70 be disposed in the overlapping region, in which the main surface 91b overlaps the peaking amplifier 11B. The advantage of disposing the switch 31 in the overlapping region is a shortening of transmission signal wiring that connects the power amplifier circuit 10 and the switch 31 to each other. This enables a reduction in the transmission loss for transmission signals.

The via conductors 95v1, which extend through the module substrate 91 perpendicularly to the main surfaces 91a and 91b in Example 1, may each include columnar electrodes extending and cascade-connected perpendicularly to the main surfaces 91a and 91b. There is an overlap between the columnar conductors of the via conductor 95v1 when the module substrate 91 is viewed in a plan view. The via conductors 95v1 structured as above may also be regarded as the via conductors extending through the module substrate 91 perpendicularly to the main surfaces 91a and 91b.

Although the planar conductors 95p1, 95p2, and 95p3 are provided in the example above, the module substrate 91 does not necessarily include three planar conductors. It is only required that at least one planar conductor be provided.

The other end of the via conductor 95v2 may be connected to the planar conductor 95p2 or 95p3 instead of being connected to the planar conductor 95p1.

The radio-frequency module 1A according to Example 1 is configured as follows. The carrier amplifier 11A, the peaking amplifier 11B, and the phase circuit 11D are included in the power IC 11 (first semiconductor IC). The phase circuit 12B and the matching circuit 12A are included in the matching circuit IC 12.

This means that the phase circuit 12B is discretely separated from the power amplifier IC 11. The phase circuit 12B is preferably a low-loss transmission line having a high Q factor so that the phase circuit 12B is capable of transmitting high-power transmission signals output by the carrier amplifier 11A and high-power transmission signals output by the peaking amplifier 11B. Similarly, in order for the matching circuit 12A to be capable of transmitting high-power transmission signals, it preferably includes a circuit element such as an inductor having a high Q factor. Unlike the case with the power amplifier IC 11, the matching circuit IC 12, which is discretely separated from the power amplifier IC 11, may be formed from a dielectric material selected with a view to achieving a high Q factor instead of being formed from a dielectric material selected with consideration given to amplification characteristics. This is conducive to reducing the transmission loss for transmission signals.

The matching IC 12 may be configured as an integrated passive device (IPD). The phase circuit 12B may be configured as an IPD separate from the matching circuit 12A. The miniaturization of the phase circuit 12B enables the radio-frequency module 1A to achieve a further reduction in size.

The phase circuit 12B may be embedded in the module substrate 91.

The carrier amplifier 11A and the peaking amplifier 11B of the radio-frequency module 1A according to Example 1 are disposed between the phase circuit 11D and the phase circuit 12B when the module substrate 91 is viewed in a plan view as illustrated in part (a) of FIG. 2A.

This layout conforms to the flow of transmission signals that pass through the phase circuit 11D, the carrier amplifier 11A or the peaking amplifier 11B, and the phase circuit 12B in the stated order. This enables a shortening of wiring forming connections between these elements, and the transmission loss for transmission signals may be reduced accordingly.

The low-noise amplifier 21 and the switch 32 of the radio-frequency module 1A in Example 1 may be configured as a semiconductor IC 80.

As described above, the power amplifier IC 11, the matching circuit IC 12, the duplexers 61 and 62, the matching circuits 51 and 52, and the switches 33 and 34 are disposed on the main surface 91a. The low-noise amplifier 21, the PA control circuit 70, the matching circuit 53, the switches 31 and 32, and the diplexer 60 are disposed on the main surface 91b. However, circuit elements of the radio-frequency module 1A according to Example 1 except for the power amplifier IC 11 on the main surface 91a and the low-noise amplifier 21 on the main surface 91b may be arranged differently. Specifically, circuit elements disposed on the main surface 91b may include at least one of the following: the duplexers 61 and 62, the matching circuits 51 and 52, and the switches 33 and 34. Circuit elements disposed on the main surface 91a may include at least one of the following: the PA control circuit 70, the matching circuit 53, the switches 31 and 32, and the diplexer 60.

The module substrate 91 has a multilayer structure including dielectric layers stacked on each other. At least one of the dielectric layers preferably include a ground electrode pattern. This makes the module substrate 91 more capable of blocking electromagnetic fields.

Figure 2C:
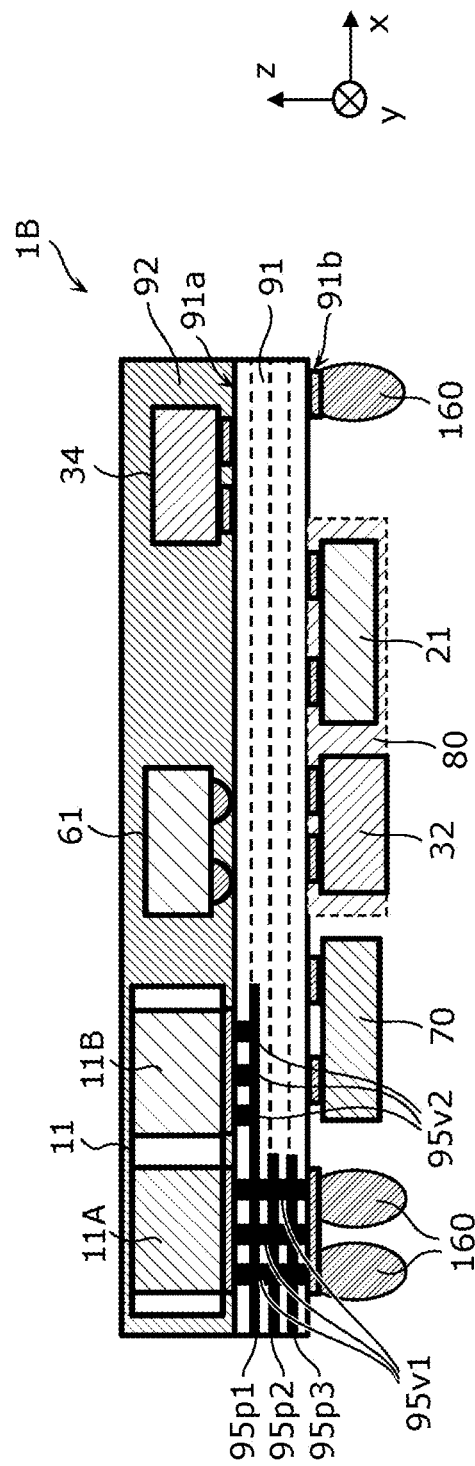
FIG. 2C is a schematic diagram illustrating the sectional configuration of a radio-frequency module according to a modification.

The external connection terminals 150 may be columnar electrodes extending in the z-axis direction through the resin member 93 as illustrated in FIGS. 2A and 2B. Alternatively, the external connection terminals 150 (and the external connection terminals 150g) may be bump electrodes on the main surface 91b and may be denoted by 160 as in FIG. 2C, which illustrates the radio-frequency module 1B according to a modification. In this case, the resin member 93 on the main surface 91b is optional.

3. Layout of Circuit Elements of Radio-Frequency Module 1C According to Example 2

Figure 3A:
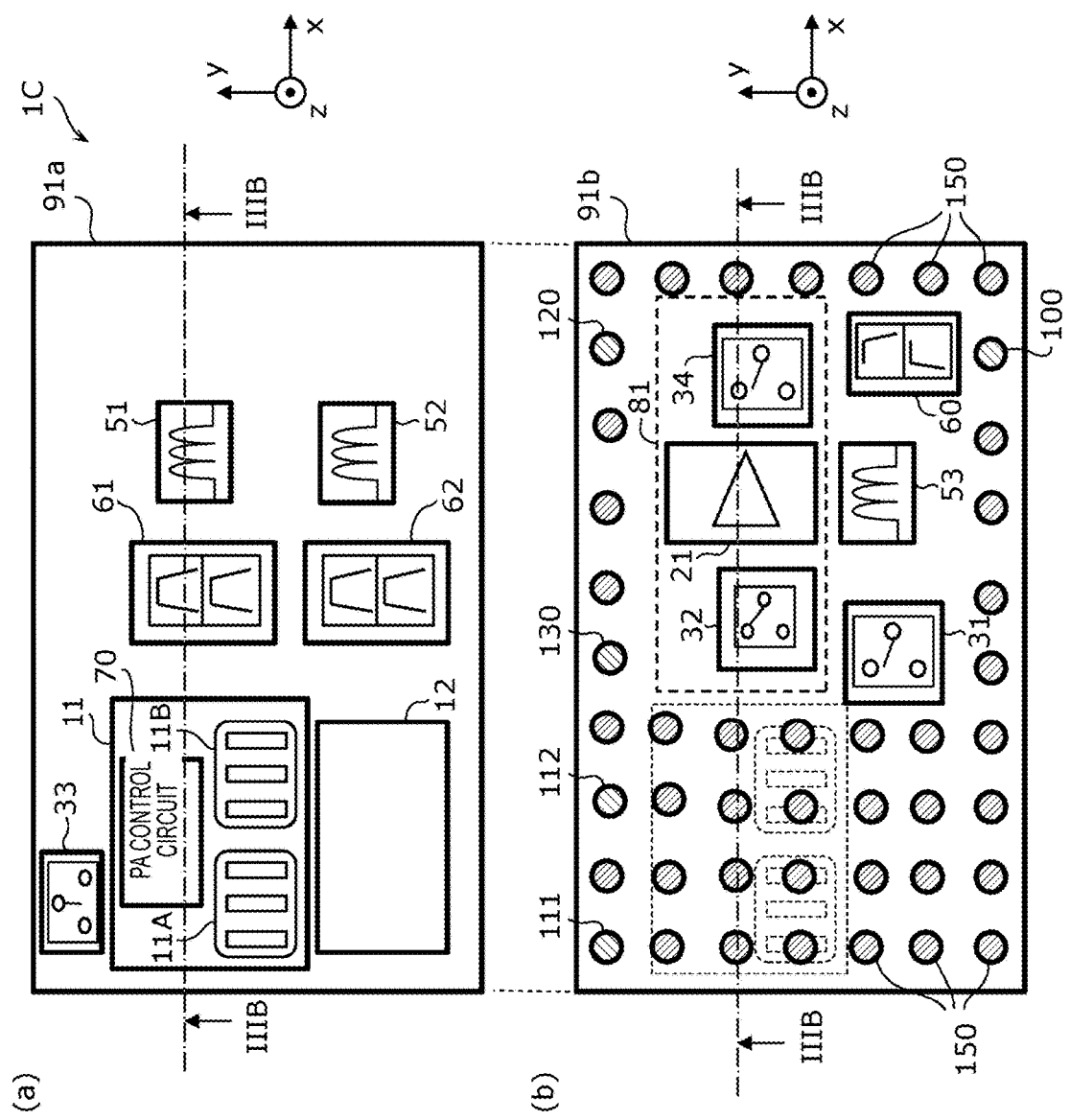
FIG. 3A is a schematic diagram illustrating the planar configuration of a radio-frequency module according to Example 2.
Figure 3B:
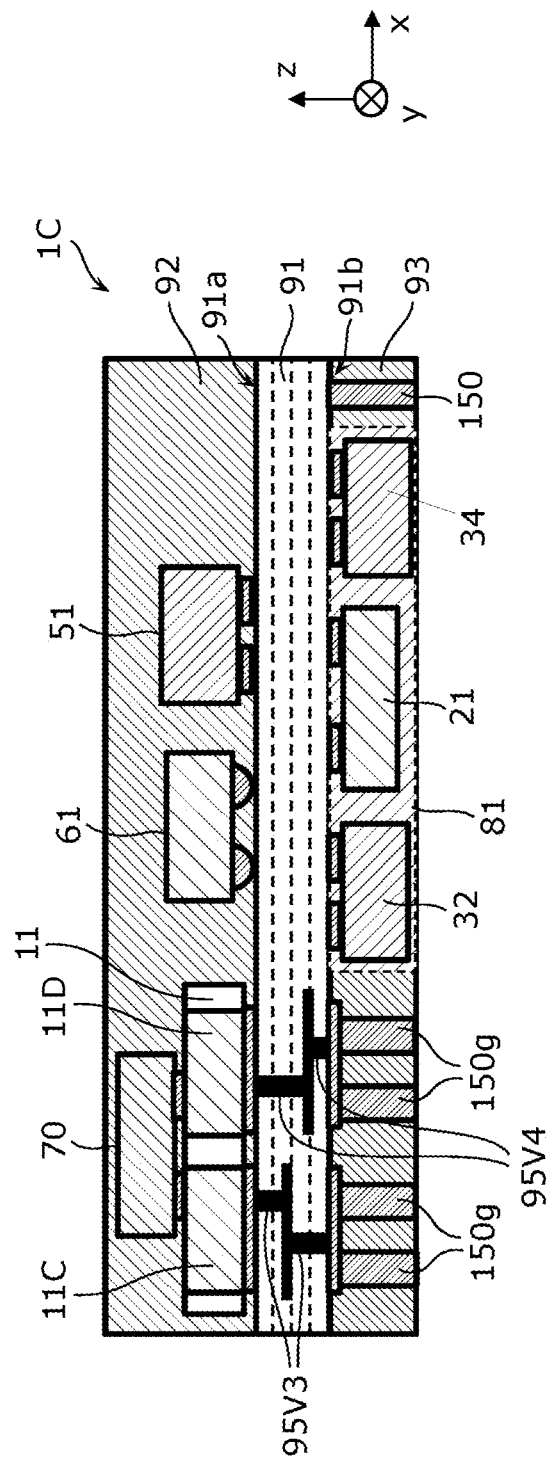
FIG. 3B is a schematic diagram illustrating the sectional configuration of the radio-frequency module according to Example 2.

FIG. 3A is a schematic diagram illustrating the planar configuration of a radio-frequency module 1C according to Example 2. FIG. 3B is a schematic diagram illustrating the sectional configuration of the radio-frequency module 1C according to Example 2. More specifically, FIG. 3B is a sectional view taken along line IIIB-IIIB in FIG. 3A. Part (a) of FIG. 3A illustrates the layout of circuit elements on the module substrate 91 having the main surfaces 91a and 91b on opposite sides, with the main surface 91a being seen from the positive side in the z-axis direction. Part (b) of FIG. 3A illustrates the layout of the circuit elements, with the main surface 91b being seen through from the positive side in the z-axis direction.

The layout of the circuit elements of the radio-frequency module 1 according to the present embodiment will be specifically presented in the following description of the radio-frequency module 1C according to Example 2.

The layout of the circuit elements of the radio-frequency module 1C according to Example 2 is different from the layout of the circuit elements of the radio-frequency module 1A according to Example 1. Configurations common to the radio-frequency module 1C according to Example 2 and the radio-frequency module 1A according to Example 1 will be omitted from the following description, which will be given while focusing on distinctive features of the radio-frequency module 1C.

Referring to FIGS. 3A and 3B illustrating the radio-frequency module 1C according to Example 2, the power amplifier IC 11, the matching IC 12, the PA control circuit 70, the duplexers 61 and 62, the matching circuit 51 and 52, and the switch 33 are disposed on the main surface 91a of the module substrate 91. The low-noise amplifier 21, the matching circuit 53, the switches 31, 32, and 34, and the diplexer 60 are disposed on the main surface 91b of the module substrate 91.

The carrier amplifier 11A and the peaking amplifier 11B in Example 2 are disposed on the main surface 91a. The low-noise amplifier 21 is disposed on the main surface 91b.

This layout enables the radio-frequency module 1C to achieve size reduction in a way that least compromises the isolation of the receiving circuits from the transmission circuits, thus eliminating or reduces the possibility that transmission signals and harmonic waves of the signals will flow into the reception paths, and the degradation of reception sensitivity is inhibited accordingly.

As illustrated in FIG. 3B, the radio-frequency module 1C also includes a via conductor 95v3 and a via conductor 95v4, which are disposed in the module substrate 91. The via conductors 95v3 and 95v4 constitute an example of the heat-dissipating conductor portion that is provided in the module substrate 91 to form a connection between the main surface 91a and the main surface 91b. On the main surface 91a, the heat-dissipating conductor portion is connected to the ground electrode of the carrier amplifier 11A and to the ground electrode of the peaking amplifier 11B. On the main surface 91b, the heat-dissipating conductor portion is connected to the external connection terminals 150g (first external connection terminals).

The via conductor 95v3 and the via conductor 95v4 extend perpendicularly to the main surfaces 91a and 91b (i.e., in the z-axis direction).

The via conductor 95v3 has an end connected, on the main surface 91a, to the ground electrode of the carrier amplifier 11A and has an end connected, on the main surface 91b, to the external connection terminals 150g.

The via conductor 95v4 has an end connected, on the main surface 91a, to the ground electrode of peaking amplifier 11B and an end connected, on the main surface 91b, to the external connection terminals 150g.

The carrier amplifier 11A is connected to the external connection terminals 150g through the via conductor 95v3 for heat dissipation. The peaking amplifier 11B is connected to the external connection terminals 150g through the via conductor 95v4 for heat dissipation. That is, the power amplifier circuit 10 is connected to the external connection terminals 150g through the via conductors 95v3 and 95v4 for heat dissipation. This configuration enables the radio-frequency module 1C to dissipate the heat of the power amplifier circuit 10 efficiently to the outside.

Referring to FIG. 3B illustrating the radio-frequency module 1C in Example 2, the PA control circuit 70 is stacked on the power amplifier IC 11 on the main surface 91a. As illustrated in part (a) of FIG. 3A, the PA control circuit 70 overlaps neither the carrier amplifier 11A nor the peaking amplifier 11B when the module substrate 91 is viewed in a plan view.

This layout eliminates the need to leave a space for the PA control circuit 70 on the main surface of the module substrate 91 and thus enables the radio-frequency module 1C to achieve size reduction. The PA control circuit 70 is not disposed on the upper side (i.e., on the positive side in the y-axis direction) of the carrier amplifier 11A and the peaking amplifier 11B, in which the amount of heat generated is greater than the amount of heat generated in any other circuit element of the power amplifier IC 11. This layout eliminates or reduces the possibility that the heat generated in the power amplifier IC 11 will raise the temperature of the PA control circuit 70 and will degrade the control performance of the PA control circuit 70 accordingly.

When the module substrate 91 is viewed in a plan view, the PA control circuit 70 does not overlap the carrier amplifier 11A although the PA control circuit 70 may overlap the peaking amplifier 11B.

When the amplification operation is continued for a given period of time, the amount of heat generated in the carrier amplifier 11A is greater than the amount of heat generated in the peaking amplifier 11B. The PA control circuit 70 is not disposed on the upper side (i.e., on the positive side in the y-axis direction) of the carrier amplifier 11A, in which the amount of heat generated is greater than the amount of heat generated in the peaking amplifier 11B. This layout eliminates or reduces the possibility that the heat generated in the carrier amplifier 11A will raise the temperature of the PA control circuit 70 and will degrade the control performance of the PA control circuit 70 accordingly.

The phase circuit 12B and the switch 34 of the radio-frequency module 1C according to Example 2, respectively, are disposed on the main surfaces 91a and 91b. That is, the phase circuit 12B and the switch 34 are disposed on opposite sides with the module substrate 91 therebetween.

This layout eliminates or reduces the possibility that transmission signals, harmonic waves, or intermodulation distortion from the power amplifier circuit 10 will be electromagnetically coupled to the switch 34. For example, a transmission signal in the communication band A or B is kept from bypassing the transmitting filter 61T or 62T and the switch 31 and flowing into the reception path AR or BR. Owing to the improved isolation of the receiving circuits from the transmitting circuits, spurious waves associated with the transmission signals, harmonic waves, or intermodulation distortion are kept from flowing into the reception paths. This eliminates or reduces the possibility that the reception sensitivity will degrade.

The low-noise amplifier 21 and the switches 32 and 34 of the radio-frequency module 1C in Example 2 may be configured as a semiconductor IC 81.

As described above, the power amplifier IC 11, the matching circuit IC 12, the PA control circuit 70, the duplexers 61 and 62, the matching circuits 51 and 52, and the switch 33 are disposed on the main surface 91a. The low-noise amplifier 21, the matching circuit 53, the switches 31, 32, and 34, and the diplexer 60 are disposed on the main surface 91b. However, circuit elements of the radio-frequency module 1C according to Example 2 except for the power amplifier IC 11 and the PA control circuit 70 on the main surface 91a and the low-noise amplifier 21 on the main surface 91b may be arranged differently. Specifically, circuit elements disposed on the main surface 91b may include at least one of the following: the duplexers 61 and 62, the matching circuits 51 and 52, and the switch 33. Circuit elements disposed on the main surface 91a may include at least one of the following: the matching circuit 53, the switches 31, 32, and 34, and the diplexer 60.

4. Effects

The radio-frequency module 1 according to the present embodiment includes the module substrate 91, the power amplifier circuit 10 in Doherty configuration, and the low-noise amplifier 21. The module substrate 91 has the main surface 91a and the main surface 91b on opposite sides. The power amplifier circuit 10 includes the carrier amplifier 11A, the peaking amplifier 11B, and the phase circuits 11D and 12B. The carrier amplifier 11A includes an input terminal connected to one end of the phase circuit 11D. The peaking amplifier 11B includes an input terminal connected to the other end of the phase circuit 11D. The carrier amplifier 11A includes an output terminal connected to one end of the phase circuit 12B. The peaking amplifier 11B includes an output terminal connected to the other end of the phase circuit 12B. The carrier amplifier 11A and the peaking amplifier 11B are disposed on the main surface 91a. The low-noise amplifier 21 is disposed on the main surface 91b.

That is, the carrier amplifier 11A and the peaking amplifier 11B of the power amplifier circuit 10 are disposed opposite the low-noise amplifier 21, with the module substrate 91 being located between the power amplifier circuit 10 and the low-noise amplifier 21. Unlike the case where both the power amplifier circuit 10 and the low-noise amplifier 21 are disposed on one side of the module substrate 91, the layout above enables the radio-frequency module 1 to achieve size reduction in a way that least compromises the isolation of the receiving circuits from the transmission circuits, thus eliminating or reducing the possibility that transmission signals and harmonic waves of the signals will flow into the reception paths, and the degradation of reception sensitivity is inhibited accordingly.

The radio-frequency module 1 also includes the heat-dissipating conductor portion and the external connection terminals 150. The heat-dissipating conductor portion is provided in the module substrate 91 to form a connection between the main surface 91a and the main surface 91b. The external connection terminals 150 are disposed on the main surface 91b. The heat-dissipating conductor portion is connected, on the main surface 91a, to the ground electrode of the carrier amplifier 11A and to the ground electrode of the peaking amplifier 11B and is connected, on the main surface 91b, to the external connection terminals 150g placed at the ground potential. Each of the external connection terminals 150g is one of the external connection terminals 150.

That is, the power amplifier circuit 10 is connected to the external connection terminals 150g through the heat-dissipating conductor portion. This configuration enables the radio-frequency module 1 to dissipate the heat of the power amplifier circuit 10 efficiently to the outside.

The radio-frequency module 1A may be configured as follows. The heat-dissipating conductor portion includes the via conductors 95v1, the via conductors 95v2, and the planar conductor 95p1. The via conductors 95v1 and 95v2 extend perpendicularly to the main surfaces 91a and 91b. The planar conductor 95p1 lies parallel to the main surfaces 91a and 91b and is in contact with neither the main surface 91a nor the main surface 91b. When the module substrate 91 is viewed in a plan view, the via conductors 95v1 overlap the carrier amplifier 11A, and the via conductors 95v2 overlap the peaking amplifier 11B. The via conductors 95v1 each have an end connected, on the main surface 91a, to the ground electrode of the carrier amplifier 11A and each have an end connected, on the main surface 91b, to the external connection terminals 150g. Each via conductor 95v1 between the ends thereof is connected to the planar conductor 95p1. The via conductors 95v2 each have an end connected, on the main surface 91a, to the ground electrode of the peaking amplifier 11B and each have an end connected to the planar conductor 95p1.

The heat generated in the carrier amplifier 11A of the radio-frequency module 1A is dissipated with a high degree of efficiency through heat transfer paths of low thermal resistance. The heat generated in the peaking amplifier 11B is dissipated less efficiently through the heat transfer paths whose thermal resistance is higher than the thermal resistance of the heat transfer paths for the heat generated in the carrier amplifier 11A. However, the disparity in the heat dissipation efficiency can be offset by the fact that the amount of heat generated in the carrier amplifier 11A is greater than the amount of heat generated in the peaking amplifier 11B. The heat transfer paths enable well-balanced thermal dissipation accordingly. There is an overlap between the main surface 91b and the peaking amplifier 11B when the module substrate 91 is viewed in a plan view. The via conductors for heat dissipation are not exposed at the main surface 91b in the overlapping region. The external connection terminals 150g are not disposed in the overlapping region, which can thus be a mounting place for a circuit component. This leads to the enhanced efficiency in the layout of the circuit components on the main surface 91b, and space savings can be achieved accordingly.

The carrier amplifier 11A and the peaking amplifier 11B of the radio-frequency module 1 may be disposed between the phase circuit 11D and the phase circuit 12B when the module substrate 91 is viewed in a plan view.

This layout conforms to the flow of transmission signals that pass through the phase circuit 11D, the carrier amplifier 11A or the peaking amplifier 11B, and the phase circuit 12B in the stated order. This enables a shortening of wiring forming connections between these elements, and the transmission loss for transmission signals may be reduced accordingly.

The radio-frequency module 1 may be configured as follows: the carrier amplifier 11A, the peaking amplifier 11B, and the phase circuit 11D of the radio-frequency module 1 are included in the power amplifier IC 11, whereas the phase circuit 12B is not included in the power amplifier IC 11.

The phase circuit 12B is preferably a low-loss transmission line having a high Q factor so that the phase circuit 12B is capable of transmitting high-power transmission signals output by the carrier amplifier 11A and high-power transmission signals output by the peaking amplifier 11B. The phase circuit 12B, which is not included in the power amplifier IC 11, may be formed from a dielectric material selected with a view to achieving a high Q factor instead of being formed from a dielectric material selected with consideration given to amplification characteristics. This is conducive to reducing the transmission loss for transmission signals.

The radio-frequency module 1C may include the PA control circuit 70 that controls the carrier amplifier 11A and the peaking amplifier 11B. The PA control circuit 70 is stacked on the power amplifier IC 11 on the main surface 91a. The PA control circuit 70 does not overlap the carrier amplifier 11A when the module substrate 91 is viewed in a plan view.

This layout eliminates the need to leave a space for the PA control circuit 70 on the main surface of the module substrate 91 and thus enables the radio-frequency module 1C to achieve size reduction. The PA control circuit 70 is not disposed on the upper side (i.e., on the positive side in the y-axis direction) of the carrier amplifier 11A, in which the amount of heat generated is greater than the amount of heat generated in any other circuit element of the power amplifier IC 11. This layout eliminates or reduces the possibility that the heat generated in the carrier amplifier 11A will raise the temperature of the PA control circuit 70 and will degrade the control performance of the PA control circuit 70 accordingly.

The radio-frequency module 1C may be configured in such a manner that the PA control circuit 70 does not overlap the peaking amplifier 11B when the module substrate is viewed in a plan view.

This eliminates or reduces the possibility that the heat generated in the carrier amplifier 11A and the heat generated in the peaking amplifier 11B will raise the temperature of the PA control circuit 70 and will degrade the control performance of the PA control circuit 70 accordingly.

The radio-frequency module 1C may also include the antenna connection terminal 100, the transmitting filter 61T, and the switch 34. The transmitting filter 61T allows a transmission signal from the power amplifier circuit 10 to pass therethrough. The switch 34 performs switching between the state in which the antenna connection terminal 100 is connected to the transmitting filter 61T and the state in which the antenna connection terminal 100 is not connected to the transmitting filter 61T. The phase circuit 12B may be disposed on the main surface 91a. The switch may be disposed on the main surface 91b.

This configuration eliminates or reduces the possibility that transmission signals, harmonic waves, or intermodulation distortion from the power amplifier circuit 10 will be electromagnetically coupled to the switch 34. A transmission signal in the communication band A or B is kept from bypassing, for example, the transmitting filter 61T and flowing into the reception path AR or BR. That is, spurious waves associated with the transmission signals, harmonic waves, or intermodulation distortion are kept from flowing into the reception paths. This eliminates or reduces the possibility that the reception sensitivity will degrade.

The phase circuit 12B of the radio-frequency module 1 may be an integrated passive device.

The miniaturization of the phase circuit 12B enables the radio-frequency module 1 to achieve a further reduction in size.

The communication device 5 includes the antenna 2, the RFIC 3, and the radio-frequency module 1. The RFIC 3 process radio-frequency signals transmitted via the antenna 2 and radio-frequency signals received via the antenna 2. The radio-frequency module 1 transmits the radio-frequency signals between the antenna 2 and the RFIC 3.

This enables a reduction in the size of the communication device 5 in a way that least compromises the isolation of the receiving circuits from the transmission power amplifier circuit in Doherty configuration.

Other Embodiments

The radio-frequency module and the communication device according to the present disclosure are not limited to the embodiment, the examples, and the modifications that have been described so far. The present disclosure embraces other embodiments implemented by varying combinations of constituent elements of the embodiment above and the modifications thereof, other modifications achieved through various alterations to the embodiment above and modifications thereof that may be conceived by those skilled in the art within a range not departing from the spirit of the present disclosure, and various types of apparatuses including the radio-frequency module and the communication device.

In each of the radio-frequency modules and the communication devices according to the embodiment, the examples, and the modifications, the paths forming connections between the circuit elements and the signal paths illustrated in the drawings may have, for example, other circuit elements and wiring disposed thereon.

INDUSTRIAL APPLICABILITY

The present disclosure, or more specifically, a radio-frequency module including high-power transmission circuits has wide applicability to communication apparatuses such as mobile phones.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A radio-frequency module comprising:
   a module substrate having a first main surface and a second main surface on opposite sides;
   a low-noise amplifier disposed on the second main surface;
   a power amplifier circuit, at least part of which is disposed on the first main surface;
   a first resin configured to seal the power amplifier circuit;
   a second resin configured to seal the low-noise amplifier;
   a through via penetrating the first main surface and the second main surface; and
   a first external connection terminal connected to the through via and penetrating the second resin, wherein
   the power amplifier circuit includes
      a first phase circuit;
      a second phase circuit;
      a carrier amplifier disposed on the first main surface and including an input terminal connected to the first phase circuit and an output terminal connected to the second phase circuit; and
      a peaking amplifier disposed on the first main surface and including an input terminal connected to the first phase circuit and an output terminal connected to the second phase circuit, and
   the through via is connected to the carrier amplifier and overlaps the carrier amplifier when the module substrate is viewed in a plan view.

2. The radio-frequency module of claim 1, further comprising:
   a heat-dissipating conductor provided in the module substrate.

3. The radio-frequency module of claim 2, wherein
   the heat-dissipating conductor forms a connection between the first main surface and the second main surface.

4. The radio frequency module of claim 1, further comprising:
   a plurality of external connection terminals, including the first external connection terminal, disposed on the second main surface.

5. The radio-frequency module of claim 1, wherein
   the carrier amplifier, the peaking amplifier, and the first phase circuit are included in a first semiconductor integrated circuit.

6. The radio-frequency module of claim 5, wherein
   the second phase circuit is not included in the first semiconductor integrated circuit.

7. The radio-frequency module of claim 5, further comprising:
   a control circuit configured to control the carrier amplifier and the peaking amplifier.

8. The radio-frequency module of claim 7, wherein
the control circuit is stacked on the first semiconductor integrated circuit on the first main surface.

9. The radio-frequency module of claim 8, wherein
when the module substrate is viewed in a plan view, the control circuit does not overlap the carrier amplifier.

10. The radio-frequency module of claim 9, wherein
when the module substrate is viewed in a plan view, the control circuit does not overlap the peaking amplifier.

11. The radio-frequency module of claim 1, further comprising:
a control circuit configured to control the carrier amplifier and the peaking amplifier.

12. The radio-frequency module of claim 11, wherein
when the module substrate is viewed in a plan view, the control circuit does not overlap the carrier amplifier.

13. The radio-frequency module of claim 11, wherein
when the module substrate is viewed in a plan view, the control circuit does not overlap the peaking amplifier.

14. The radio-frequency module of claim 1, further comprising:
an antenna connection terminal.

15. The radio-frequency module of claim 14, further comprising:
a transmitting filter that allows a transmission signal from the power amplifier circuit to pass therethrough.

16. The radio frequency module of claim 15, further comprising:
an antenna switch that performs switching between a state in which the antenna connection terminal is connected to the transmitting filter and a state in which the antenna connection terminal is not connected to the transmitting filter.

17. The radio frequency module of claim 16, wherein
the second phase circuit is disposed on the first main surface, and
the antenna switch is disposed on the second main surface.

18. A radio-frequency module comprising:
a module substrate having a first main surface and a second main surface on opposite sides;
a low-noise amplifier disposed on the second main surface;
a power amplifier circuit;
a first resin configured to seal the power amplifier circuit;
a second resin configured to seal the low-noise amplifier;
a via conductor penetrating the first main surface and the second main surface; and
a first external connection terminal connected to the via conductor and penetrating the second resin, wherein
the power amplifier circuit includes
a first phase circuit;
a second phase circuit;
a carrier amplifier disposed on the first main surface and including an input terminal connected to the first phase circuit and an output terminal connected to the second phase circuit; and
a peaking amplifier disposed on the first main surface and including an input terminal connected to the first phase circuit and an output terminal connected to the second phase circuit.

19. The radio frequency module of claim 18, wherein
the via conductor is connected to the carrier amplifier.

20. The radio frequency module of claim 19, wherein
when viewed in a plan view, a footprint of the via conductor overlaps a footprint of the carrier amplifier.

* * * * *